United States Patent
Kitazawa et al.

(10) Patent No.: US 9,880,285 B2
(45) Date of Patent: Jan. 30, 2018

(54) SEMICONDUCTOR DEVICE

(71) Applicant: Seiko Epson Corporation, Tokyo (JP)

(72) Inventors: Takeo Kitazawa, Azumino (JP); Koichi Hatanaka, Matsumoto (JP); Shigeto Chiba, Shiojiri (JP)

(73) Assignee: Seiko Epson Corporation (JP)

( * ) Notice: Subject to any disclaimer, the term of this patent is extended or adjusted under 35 U.S.C. 154(b) by 527 days.

(21) Appl. No.: 14/538,235

(22) Filed: Nov. 11, 2014

(65) Prior Publication Data

US 2015/0130662 A1 May 14, 2015

(30) Foreign Application Priority Data

Nov. 13, 2013 (JP) .................................. 2013-235404

(51) Int. Cl.
*G01S 19/35* (2010.01)
*H01L 23/64* (2006.01)
*H01L 23/00* (2006.01)
*H01F 17/00* (2006.01)
*H01L 49/02* (2006.01)

(52) U.S. Cl.
CPC ............ *G01S 19/35* (2013.01); *H01L 23/645* (2013.01); *H01L 24/14* (2013.01); *H01F 17/0006* (2013.01); *H01L 28/10* (2013.01); *H01L 2224/14132* (2013.01)

(58) Field of Classification Search
CPC ....... H01L 23/645; H01L 24/14; H01L 24/17; H01L 24/16; H01L 2224/81; G01S 19/35
See application file for complete search history.

(56) References Cited

U.S. PATENT DOCUMENTS

| 3,701,894 A | 10/1972 | Low et al. |
| 5,650,785 A | 7/1997 | Rodal |
| 5,898,665 A | 4/1999 | Sawahashi et al. |
| 5,949,812 A | 9/1999 | Turney et al. |
| 6,154,487 A | 11/2000 | Murai et al. |

(Continued)

FOREIGN PATENT DOCUMENTS

| JP | 2013-142607 A | 12/1976 |
| JP | 2000-101021 A | 4/2000 |

(Continued)

OTHER PUBLICATIONS

Jae-Chern Yoo et al., "1-D Fast Normalized Cross-Correlation Using Additions", Digital Signal Processing, Academic Press, Orlando, FL, US, vol. 20, No. 5, Sep. 1, 2010, pp. 1482-1493, XP027070377.

(Continued)

*Primary Examiner* — Phuc Dang
(74) *Attorney, Agent, or Firm* — Harness, Dickey & Pierce, P.L.C.

(57) ABSTRACT

A semiconductor device includes: a substrate; a first layer that is stacked on the substrate and includes an inductor; and a bump group that is arranged above the first layer, wherein the bump group includes a plurality of bumps that are arranged under a predetermined rule, and at least one bump that is different from the plurality of bumps and whose center does not overlap the inductor when the semiconductor device is viewed in a plan view from a direction vertical to a plane on which the bump group is provided.

9 Claims, 3 Drawing Sheets

(56) References Cited

U.S. PATENT DOCUMENTS

| | | |
|---|---|---|
| 6,377,683 B1 | 4/2002 | Dobson et al. |
| 6,888,879 B1 | 5/2005 | Lennen |
| 7,110,442 B2 | 9/2006 | Lennen |
| 7,157,794 B2 | 1/2007 | Mori |
| 7,545,036 B2 | 6/2009 | Terui et al. |
| 8,634,504 B2 | 1/2014 | Terashima et al. |
| 8,737,363 B2 | 5/2014 | Ozluturk et al. |
| 8,755,472 B2 | 6/2014 | Sun et al. |
| 2002/0150150 A1 | 10/2002 | Kohli et al. |
| 2003/0081660 A1 | 5/2003 | King et al. |
| 2003/0127704 A1* | 7/2003 | Kobayashi ......... H01F 17/0006 257/531 |
| 2003/0189251 A1 | 10/2003 | Terui et al. |
| 2003/0205808 A1 | 11/2003 | Terui et al. |
| 2004/0202235 A1 | 10/2004 | Kohli et al. |
| 2005/0230827 A1 | 10/2005 | Naito et al. |
| 2006/0056497 A1 | 3/2006 | Lennen |
| 2006/0197168 A1 | 9/2006 | Naito et al. |
| 2006/0215740 A1 | 9/2006 | Teruuchi et al. |
| 2007/0274684 A1 | 11/2007 | Yoshida et al. |
| 2008/0001287 A1* | 1/2008 | Nakashiba ........ H01L 23/49838 257/734 |
| 2008/0094132 A1 | 4/2008 | Kakemizu et al. |
| 2008/0101442 A1 | 5/2008 | Rasmussen |
| 2008/0151970 A1 | 6/2008 | Chen et al. |
| 2008/0173961 A1 | 7/2008 | Naito et al. |
| 2008/0272500 A1 | 11/2008 | Ishio |
| 2009/0066575 A1 | 3/2009 | Tsutsui |
| 2009/0168843 A1 | 7/2009 | Waters et al. |
| 2009/0168853 A1 | 7/2009 | Gobara |
| 2009/0259707 A1 | 10/2009 | Martin et al. |
| 2009/0278738 A1 | 11/2009 | Gopinath |
| 2009/0309792 A1 | 12/2009 | Hanabusa |
| 2010/0039316 A1 | 2/2010 | Gronemeyer et al. |
| 2010/0040117 A1 | 2/2010 | Lawrow |
| 2010/0254492 A1 | 10/2010 | Chen |
| 2011/0237277 A1 | 9/2011 | Terashima et al. |
| 2011/0254732 A1 | 10/2011 | Martin et al. |
| 2012/0202428 A1 | 8/2012 | Mirbaha et al. |
| 2013/0084845 A1 | 4/2013 | Kimura et al. |
| 2013/0177045 A1 | 7/2013 | Terashima |
| 2013/0177046 A1 | 7/2013 | Terashima |
| 2013/0285854 A1 | 10/2013 | Gobara |
| 2014/0071928 A1 | 3/2014 | Papasakellariou et al. |
| 2014/0092764 A1 | 4/2014 | Ogawa |
| 2014/0098788 A1 | 4/2014 | Uemura et al. |
| 2014/0119308 A1 | 5/2014 | Mochida |
| 2014/0333477 A1 | 11/2014 | Lennen |
| 2015/0206837 A1* | 7/2015 | Gu ..................... H01L 23/5389 257/531 |
| 2015/0289206 A1 | 10/2015 | Kimura et al. |
| 2015/0301192 A1 | 10/2015 | Leclercq et al. |
| 2016/0026157 A1 | 1/2016 | Baba |

FOREIGN PATENT DOCUMENTS

| | | |
|---|---|---|
| JP | 2001-042023 A | 2/2001 |
| JP | 2001-159670 A | 6/2001 |
| JP | 2002-530974 A | 9/2002 |
| JP | 2003-504919 A | 2/2003 |
| JP | 2004-179255 A | 6/2004 |
| JP | 2004-260217 A | 9/2004 |
| JP | 2005-277034 A | 10/2005 |
| JP | 2006-270510 A | 10/2006 |
| JP | 2009-063451 A | 3/2009 |
| JP | 2009-175123 A | 8/2009 |
| JP | 2009-212481 A | 9/2009 |
| JP | 2009-266964 A | 11/2009 |
| JP | 2009-276198 A | 11/2009 |
| JP | 2011-146629 A | 7/2011 |
| JP | 2011-520131 A | 7/2011 |
| JP | 2011-220998 A | 11/2011 |
| JP | 2012-010202 A | 1/2012 |
| JP | 2013-142606 A | 7/2013 |
| JP | 2013-228250 A | 11/2013 |
| JP | 2013-229056 A | 11/2013 |
| JP | 2013-235404 A | 11/2013 |
| WO | WO-00-31659 A1 | 6/2000 |
| WO | WO-01-03294 A1 | 1/2001 |
| WO | WO-2006-132007 A1 | 12/2006 |

OTHER PUBLICATIONS

World's Smallest and Thinnest 0.15 X 0.15 mm, 7.5 micro meter thick RFID IC chip. Hitachi, Ltd., Feb. 2006.

Datasheet for CXD2951GA-4 Single Chip GPS LSI, Sony Corporation.

Broadcom Product Brief for BCM4750, Broadcom Corporation, 5300 California Avenue, Irvine, CA 92617, www.broadcom.com, Nov. 30, 2007, 3 pages.

* cited by examiner

SEMICONDUCTOR DEVICE

CROSS-REFERENCE

The entire disclosure of Japanese Patent Application No. 2013-235404, filed Nov. 13, 2013 is hereby expressly incorporated by reference herein.

BACKGROUND

1. Technical Field

The present invention relates to a semiconductor device.

2. Related Art

Semiconductor devices have been known in which an analog signal processing circuit portion and a digital signal processing circuit portion are integrated as one body above a semiconductor substrate for purposes of reducing the size or cost. In the analog signal processing circuit portion, many passive elements are used. Moreover, a plurality of bumps (external electrodes) are provided on a surface of the semiconductor device (for example, refer to JP-A-2009-266964).

In the passive elements of the analog signal processing circuit portion, an inductor has a relatively large area per element in a plan view. When metal is present at a position close to the inductor, a magnetic flux changes, which may deteriorate the characteristics as an inductor. Moreover, in terms of an area in a plan view, the bump arranged on the surface of the semiconductor device has also a relatively large plan-view area per bump. Accordingly, a circuit arrangement or the number of bumps needs to be designed so as not to locate the bump above the inductor. However, in the semiconductor device intended to achieve multifunction and multicircuit integration, there is a demand to increase the number of bumps as many as possible or to further reduce the size of the entire semiconductor device.

SUMMARY

An advantage of some aspects of the invention is to implement a new semiconductor device including an inductor, in which deterioration in the characteristics of the inductor is suppressed.

A first aspect of the invention is directed to a semiconductor device including: a substrate; a first layer that is stacked on the substrate and includes an inductor; and a bump group that is arranged above the first layer, wherein the bump group includes a plurality of bumps that are arranged under a predetermined rule, and at least one bump that is different from the plurality of bumps and whose center does not overlap the inductor when the semiconductor device is viewed in a plan view from a direction vertical to a plane on which the bump group is provided.

According to the first aspect of the invention, the bump as a portion of the bump group is arranged at a position where the center of the bump does not overlap the inductor in the plan view. The bump group includes the plurality of bumps that are arranged under the predetermined rule. By arranging the bump that might influence the inductor at a position above the inductor where the center of the bump is shifted from the middle of the inductor, the influence on the inductor can be reduced, so that deterioration in the characteristics of the inductor can be suppressed.

A second aspect of the invention is directed to the semiconductor device according to the aspect of the invention described above, wherein the substrate is a rectangle in shape in the plan view from the direction vertical to the plane on which the bump group is provided, the inductor is located at any of corner portions of the rectangle in the plan view from the direction vertical to the plane on which the bump group is provided, and the semiconductor device further includes an analog signal processing circuit portion that includes the inductor and processes an analog signal to output a digital signal, and a digital signal processing circuit portion that processes the digital signal and is provided spaced apart from the analog signal processing circuit portion in the plan view from the direction vertical to the plane on which the bump group is provided.

According to the second aspect of the invention, the semiconductor device including the analog signal processing circuit portion and the digital signal processing circuit portion is implemented. Moreover, the substrate is a rectangle in shape in the plan view, and the inductor is provided at any of the corner portions of the rectangle in the plan view. Since the inductor is provided at the corner portion, the number of bumps that might influence the inductor can be reduced. Moreover, the analog signal processing circuit portion includes the inductor. Further, the analog signal processing circuit portion and the digital signal processing circuit portion are provided spaced apart from each other in the plan view. For this reason, interference of electromagnetic waves from the digital signal processing circuit portion on the analog signal processing circuit portion can be reduced.

A third aspect of the invention is directed to the semiconductor device according to the aspect of the invention described above, wherein the analog signal processing circuit portion includes a power supply circuit portion between the inductor and the digital signal processing circuit portion in the plan view from the direction vertical to the plane on which the bump group is provided.

According to the third aspect of the invention, the power supply circuit portion is arranged between the inductor and the digital signal processing circuit portion in the plan view. The power supply circuit portion generates fewer electromagnetic waves than the digital signal processing circuit portion. By providing the power supply circuit portion between the inductor and the digital signal processing circuit portion, interference of electromagnetic waves that the inductor receives from the digital signal processing circuit portion can be further reduced.

A fourth aspect of the invention is directed to the semiconductor device according to the aspect of the invention described above, wherein the digital signal processing circuit portion includes a first memory that operates at a first operating frequency, and a second memory that operates at a second operating frequency lower than the first operating frequency, and a distance between the first memory and the analog signal processing circuit portion is longer than a distance between the second memory and the analog signal processing circuit portion.

According to the fourth aspect of the invention, the digital signal processing circuit portion includes the first memory whose operating frequency is relatively high and the second memory whose operating frequency is relatively low. The second memory is arranged at a position where the distance from the second memory to the analog signal processing circuit portion is shorter than the distance from the first memory to the analog signal processing circuit portion. With this configuration, the interference of electromagnetic waves that the analog signal processing circuit portion receives from the digital signal processing circuit portion can be more reduced than in the case where the distance between the first memory and the analog signal processing circuit portion is equal to or less than the distance between the second memory and the analog signal processing circuit portion.

A fifth aspect of the invention is directed to the semiconductor device according to the aspect of the invention described above, wherein the analog signal processing circuit portion is a receiver circuit portion that receives an analog signal.

According to the fifth aspect of the invention, an analog signal can be received by the semiconductor device.

A sixth aspect of the invention is directed to the semiconductor device according to the aspect of the invention described above, which further includes an LNA (Low Noise Amplifier), wherein the LNA includes the inductor.

According to the sixth aspect of the invention, the LNA included in the analog signal processing circuit portion includes the inductor. By suppressing deterioration in the characteristics of the inductor, it is possible to configure the semiconductor device in which deterioration in the characteristics of the LNA is suppressed.

A seventh aspect of the invention is directed to the semiconductor device according to the aspect of the invention described above, wherein the analog signal is a positioning satellite signal, the digital signal processing circuit portion includes a correlation operation circuit portion that performs a correlation operation for capturing the positioning satellite signal, and a first memory that operates at a first operating frequency, and a distance between the first memory and the analog signal processing circuit portion is longer than a distance between the correlation operation circuit portion and the analog signal processing circuit portion.

According to the seventh aspect of the invention, the semiconductor device can receive a positioning satellite signal. Moreover, since the semiconductor device is a receiving device of a positioning satellite signal, the correlation operation circuit portion is included in the digital signal processing circuit portion. The distance between the first memory and the analog signal processing circuit portion is longer than the distance between the correlation operation circuit portion and the analog signal processing circuit portion. The frequency of electromagnetic waves generated by the correlation operation circuit portion is relatively lower than that of electromagnetic waves generated by the first memory that operates at the first operating frequency. Therefore, by arranging the correlation operation circuit portion closer to the analog signal processing circuit portion than the first memory, the interference of electromagnetic waves that the analog signal processing circuit portion receives from the digital signal processing circuit portion can be further reduced.

An eighth aspect of the invention is directed to the semiconductor device according to the aspect of the invention described above, wherein the analog signal processing circuit portion includes three or more the inductors, and the area of a polygon obtained by connecting centers of the respective inductors in the plan view is from 0.08 mm$^2$ to 0.116 mm$^2$.

According to the eighth aspect of the invention, it is possible to configure the semiconductor device in which the three or more inductors are included and the area of the polygon in the plan view obtained by connecting the centers of the respective inductors in the plan view is from 0.08 mm$^2$ to 0.116 mm$^2$.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
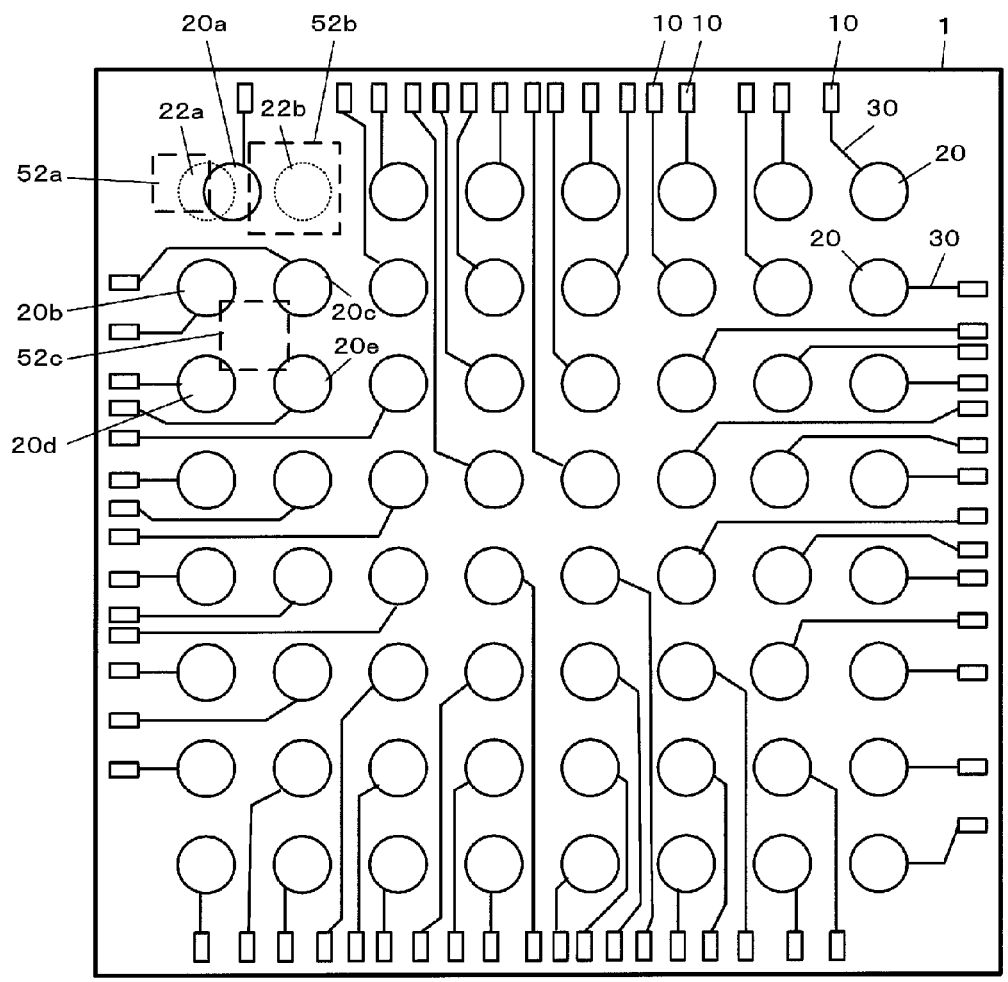
FIG. 1 is a plan view of a semiconductor device.

FIG. 1 is a plan view of a semiconductor device 1 called WCSP (Wafer-level Chip Size Package) of an embodiment, in which a sealing resin is omitted. The semiconductor device 1 has a chip size of, for example, from "3.5 mm×3.5 mm×0.5 mm" to "3.65 mm×3.65 mm×0.75 mm".

The semiconductor device 1 is configured by forming and integrating a plurality of circuit blocks including transistors, resistors, capacitors, and inductors on (a surface of) a semiconductor substrate (corresponding to a substrate) having a rectangle shape in a plan view (a plan view from a direction vertical to a plane on which a bump group is provided; hereinafter the same applies unless otherwise noted). A layer in which the circuit blocks are formed is hereinafter referred to as "first layer". A plurality of electrode pads 10 connected to the circuit blocks are formed above the first layer along the four sides of the semiconductor device 1. The electrode pad 10 is connected with a wiring (redistribution wiring) 30 formed of, for example, copper. A layer in which the electrode pads 10 and the wirings 30 are formed is hereinafter referred to as "second layer". In a region, above the second layer, inside a region where the electrode pads 10 are formed in the plan view, a bump group including a plurality of bumps (ball electrodes) 20 as external electrodes is formed, and connected with the electrode pads 10 through the wirings 30. That is, the bump group is arranged on the side opposite to the substrate with respect to the first layer. The bumps 20 are terminals for connecting the semiconductor device 1 with the outside (for example, a processor that controls the semiconductor device 1, or the like). An insulating layer formed of polyimide or the like is formed above the semiconductor substrate excluding the bumps 20. With this structure, the bumps 20 are exposed from the insulating layer. The "rectangle" is an oblong or square, and each side may not be a perfect straight line in the plan view.

The bumps 20 are arranged under a predetermined rule excluding a bump 20a as a portion of the bump group. In the embodiment, the arrangement rule of the bumps 20 is such that the bumps 20 are arranged in horizontal rows and vertical columns. However, the bumps 20 may be arranged in a double or triple annular shape so as to surround the central portion. The bump 20a is arranged at a position where the bump partially overlaps inductors 52a and 52b when viewed in the plan view, which is different from the arrangement rule of the other bumps.

More specifically, the bump 20a is arranged at a position where the center of the bump 20a does not overlap the inductors in the plan view. The bump 20a is arranged such that the overlapping area of the inductors 52a and 52b and the bump 20a is less than one-half the area of the inductors 52a and 52b. The "center of the bump 20a" is the circumcenter (the center of a circumcircle) or incenter (the center of an incircle) of the shape (a circle in the embodiment) of outline of the bump 20a in the plan view. In the specification, the "inductor" includes a coil portion of the inductor and its surrounding region unless otherwise noted. Moreover, the wirings 30 are arranged at positions not overlapping the inductors 52a and 52b and an inductor 52c when viewed in the plan view.

In FIG. 1, the three inductors 52a to 52c are arranged at the upper left corner portion of the four corner portions in the semiconductor device 1. The sizes of the inductors 52a to 52c are determined based on required performances, in which at least one of the inductors 52a to 52c has a width, in the plan view, longer than an interval (a distance between the centers) between the two bumps 20 next to each other when the bumps 20 are arranged under the predetermined rule. Here, the width of the inductor is a width in a direction parallel to a direction connecting the centers of the two bumps 20.

Tentative positions 22a and 22b when the bumps 20 are tentatively arranged under the predetermined rule (rows and columns) are shown by dotted lines in FIG. 1. The upper left tentative position 22a and the inductor 52a overlap each other with the overlapping area equal to or more than one-half the area of the inductor 52a. The tentative position 22b to the right of the tentative position 22a and the inductor 52b overlap each other with the overlapping area equal to or more than one-half the area of the inductor 52b. For this reason, the bumps 20 are not arranged at the tentative positions 22a and 22b, but the bump 20a is arranged between the inductors 52a and 52b. When the bump 20a is arranged in this manner, the number of bumps is reduced by one, compared with the case where the bumps are arranged at the tentative positions 22a and 22b. However, deterioration in the characteristics of the inductor can be more suppressed than in the case where the bumps are arranged at the tentative positions 22a and 22b. Moreover, one more bump can be arranged than in the case where the bumps are not arranged at the tentative positions 22a and 22b.

The inductor 52c overlaps each of four bumps 20b to 20e around the inductor 52c. However, the area of overlapping portions is less than one-half the area of the inductor 52c, and the inductor partially overlaps the bumps. Therefore, as in FIG. 1, the four bumps 20b to 20e are arranged under the predetermined rule. Although, in FIG. 1, all of the bumps 20 other than the bump 20a are arranged under the predetermined rule, another bump 20 arranged differently from the predetermined rule may be present.

Figure 2:
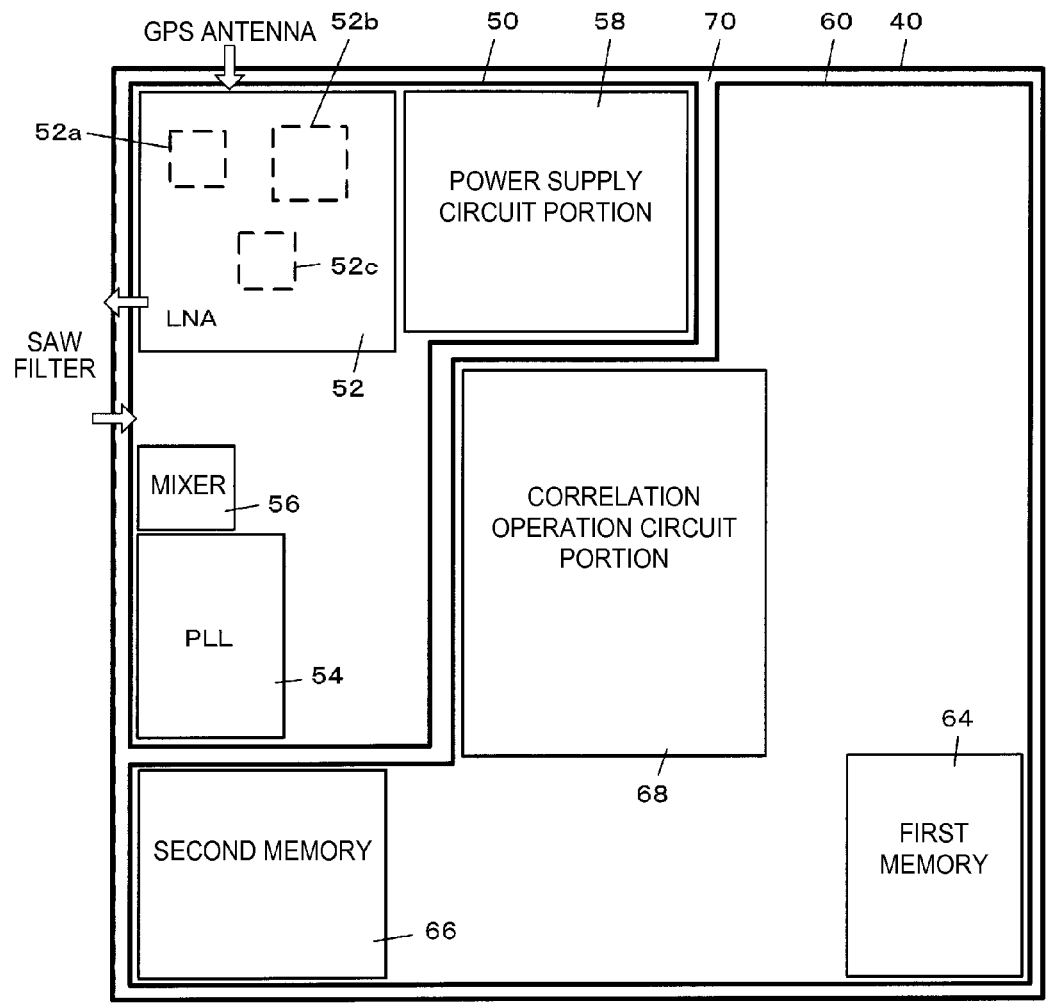
FIG. 2 is a schematic arrangement view of circuit blocks constituting an integrated circuit.

FIG. 2 is a schematic arrangement view (layout view) of the circuit blocks constituting an integrated circuit 40 provided in an inner layer of the semiconductor device. In the following description, a description of the positional relationship of the circuit blocks is made based on a positional relationship in the plan view unless otherwise noted. In the integrated circuit 40 (the first layer) of the embodiment, a GPS (Global Positioning System) receiver circuit that receives GPS satellite signals and performs a positioning operation is formed. When the integrated circuit 40 is the GPS receiver circuit, the semiconductor device 1 is connected with an external GPS antenna, and receives GPS satellite signals via the GPS antenna. The semiconductor device 1 can be said to be an analog signal processing device or a satellite signal processing device.

The GPS receiver circuit roughly includes an RF (Radio Frequency) receiver circuit portion 50 as an analog signal processing circuit portion and a baseband processing circuit portion 60 as a digital signal processing circuit portion. The RF receiver circuit portion 50 receives a GPS satellite signal as an analog signal and converts the GPS satellite signal into a digital signal by performing analog signal processing. The baseband processing circuit portion 60 performs digital signal processing on the digital signal output from the RF receiver circuit portion 50 and performs a positioning operation to compute a position or the like.

As shown in FIG. 2, the integrated circuit 40 is configured such that the RF receiver circuit portion (analog signal processing circuit portion) 50 and the baseband processing circuit portion (digital signal processing circuit portion) 60 are arranged with a buffer zone portion 70 that reduces noise interposed therebetween. That is, the RF receiver circuit portion 50 is arranged in an L-shape on the upper left side (one side) of the semiconductor substrate in the plan view, while the baseband processing circuit portion 60 is arranged on the lower right side (the other side) spaced apart from the RF receiver circuit portion 50.

The buffer zone portion 70, which has a width of about 50 μm, is a region in which an element, a wiring, and a diffusion layer are not placed in a circuit layer in which at least the RF receiver circuit portion 50 and the baseband processing circuit portion 60 are formed. However, an element or wiring as a dummy pattern, or a DC element that does not fluctuate electrically dynamically may be arranged in the buffer zone portion 70.

The RF receiver circuit portion 50 includes various types of amplifiers including an LNA (Low Noise Amplifier) 52 that amplifies signals received via the GPS antenna, an oscillation circuit portion that includes a VCO (Voltage-Controlled Oscillator), a PLL (Phase-Locked Loop) 54, and a loop filter and generates local signals (local frequency signals), a mixer 56 that combines the amplified received signals with the local signals to down-convert to IF (Intermediate Frequency) signals, various types of filters such as a PPF (Poly-Phase Filter) or LPF (Low-Pass Filter), and an A/D (Analog to Digital) conversion circuit that converts analog signals into digital signals.

The LNA 52 includes the inductors 52a to 52c. The LNA 52 and also the inductors 52a to 52c are arranged at the upper left corner portion as the position farthest from the baseband processing circuit portion 60. This is for suppressing an influence of the circuit operation of the baseband processing circuit portion 60 on the inductors 52a to 52c.

Figure 3:
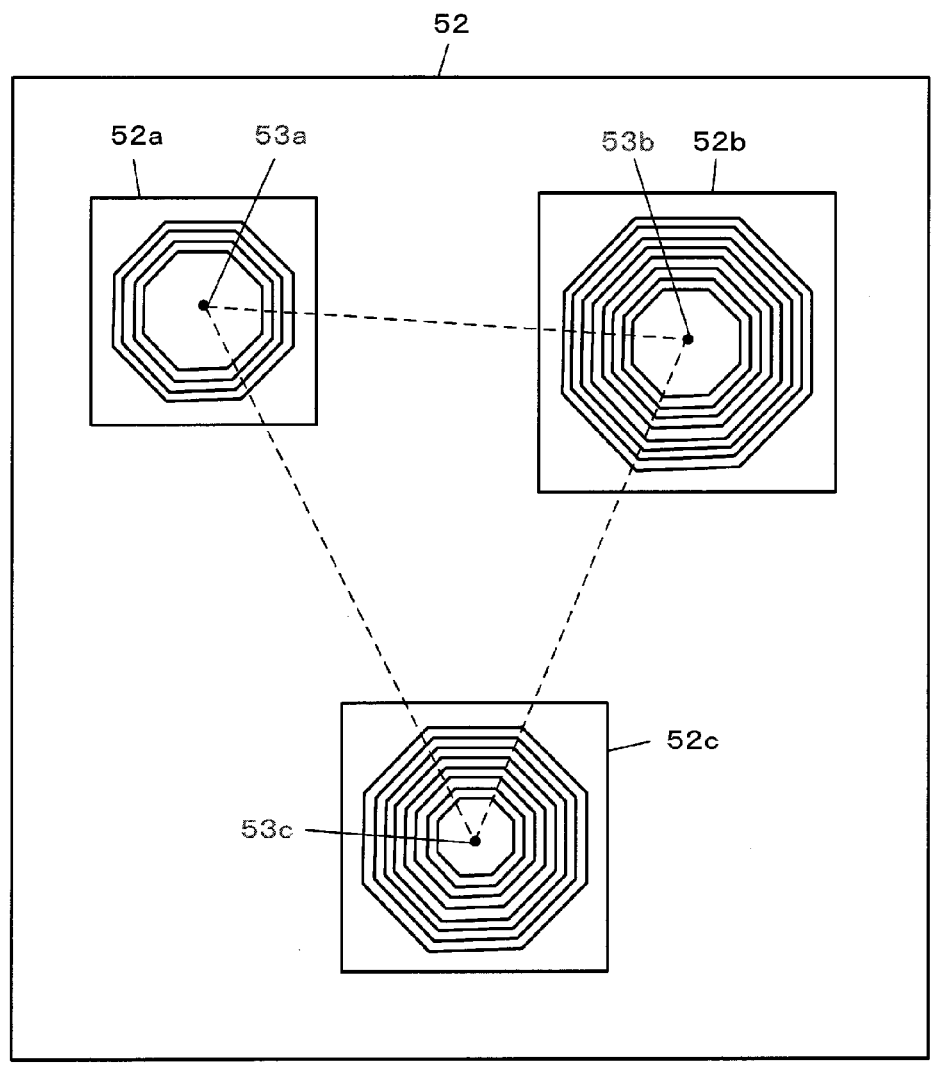
FIG. 3 shows a relative positional relationship of inductors.

The LNA 52 includes the three inductors 52a to 52c. The inductor 52a is an input matching inductor, while the inductors 52b and 52c are load inductors. FIG. 3 shows a relative positional relationship of the inductors 52a to 52c. When considering a polygon (a triangle in this case) with centers 53a to 53c of the respective inductors 52a to 52c as vertexes, the area of the polygon is "0.115681 mm$^2$". In the case of forming three or more inductors, when the area of a polygon obtained by connecting the centers of the respective inductors in the plan view is within a range "from 0.08 to 0.116 mm$^2$", it is preferable for a reduction in the size of the semiconductor device 1 and manufacture thereof, to which the embodiment corresponds. The "center of the inductor" is the center (the center of a circumcircle or incircle) of the coil portion of the inductor in the plan view.

The PLL 54 is arranged at a position next to the baseband processing circuit portion 60 with the buffer zone portion 70 therebetween. The mixer 56 is arranged at a position next to the PLL 54 for generating local signals while being arranged on the side opposite to the buffer zone portion 70 with the PLL 54 interposed therebetween. The other circuit components constituting the RF receiver circuit portion 50 are arranged such that each wiring between the circuit components becomes short in consideration of the flow of signals in the RF receiver circuit portion 50.

The RF receiver circuit portion 50 includes, at a position next to the baseband processing circuit portion 60 with the buffer zone portion 70 therebetween, that is, between the LNA 52 and the baseband processing circuit portion 60, a power supply circuit portion 58 that supplies DC power to the RF receiver circuit portion 50 and the baseband processing circuit portion 60. The power supply circuit portion 58 is an LDO (Low Drop-Out regulator). The power supply circuit portion 58 supplies stable DC voltage for driving the integrated circuit 40. The LDO is less likely to generate electromagnetic waves. By providing the power supply circuit portion 58 between the inductors 52a to 52c and the baseband processing circuit portion 60, electromagnetic wave interference that the inductors 52a to 52c receive from the baseband processing circuit portion 60 can be further reduced.

In the embodiment, the RF receiver circuit portion 50 includes one power supply circuit portion 58. However, the RF receiver circuit portion 50 and the baseband processing circuit portion 60 may each include an individual power supply circuit. Moreover, the baseband processing circuit portion 60 may include the power supply circuit portion 58. Moreover, power supply of the RF receiver circuit portion 50 or the baseband processing circuit portion 60 may be performed using a power supply connected to the outside of the semiconductor device 1. Alternatively, a configuration capable of selecting which of an external power supply and the power supply circuit portion 58 to use may be employed.

The baseband processing circuit portion 60 includes a CPU (Central Processing Unit), a first memory 64, a second memory 66, and a correlation operation circuit portion 68 that performs a correlation operation between a received signal (digital signal) and a replica code for capturing a GPS satellite signal.

The correlation operation circuit portion 68 is arranged at a position next to the RF receiver circuit portion 50 with the buffer zone portion 70 therebetween. The CPU is arranged around the correlation operation circuit portion 68 (in FIG. 2, the CPU is included in a region indicated as the correlation operation circuit portion 68). The first memory 64 is arranged at the lower right corner portion away from the RF receiver circuit portion 50. The second memory 66 whose operating frequency is lower than that of the first memory 64 is arranged at the lower left corner portion. That is, the second memory 66 is arranged at a position where a distance from the second memory to the RF receiver circuit portion 50 is shorter than a distance from the first memory 64 to the RF receiver circuit portion 50. Moreover, the correlation operation circuit portion 68 is arranged at a position where a distance from the correlation operation circuit portion 68 to the RF receiver circuit portion 50 is shorter than a distance from the first memory 64 to the RF receiver circuit portion 50. In the baseband processing circuit portion 60, the memories are most likely to generate electromagnetic waves. Moreover, the higher the operating frequency is, the more likely the electromagnetic waves are generated. Therefore, by making the arrangement in this manner, electromagnetic wave interference of the first memory 64 on the RF receiver circuit portion 50 and also on the inductors 52a to 52c can be reduced.

Operational Effect

According to the semiconductor device 1 of the embodiment as described above, deterioration in the characteristics of the inductors 52a to 52c of the integrated circuit 40 can be suppressed. That is, in the semiconductor device 1, the inductors 52a to 52c are arranged at the corner portion (in FIG. 1, the upper left corner portion) above the semiconductor substrate as viewed in the plan view, and the bumps 20 are arranged regularly in horizontal rows and vertical columns excluding the bump 20a as a portion of the bumps that is located in the vicinity of the inductors 52a to 52c. The bump 20a is arranged so as to partially overlap the inductors 52a to 52c in the plan view. With this configuration, deterioration in the characteristics of the inductors 52a to 52c due to the influence of the bump 20a is reduced.

The RF receiver circuit portion 50 as an analog signal processing circuit portion and the baseband processing circuit portion 60 as a digital signal processing circuit portion are arranged with the buffer zone portion 70 therebetween. The LNA 52 including the inductors 52a to 52c is arranged above the semiconductor substrate at the corner portion away from the baseband processing circuit portion 60. The power supply circuit portion 58 is arranged between the LNA 52 and the baseband processing circuit portion 60. With this configuration, deterioration in the characteristics of the inductors 52a to 52c due to high-frequency waves generated by the baseband processing circuit portion 60 is reduced.

Modified Examples

Embodiments to which the invention is applicable are not limited to the embodiment described above, but it is, of course, possible to appropriately change the embodiment in a range not departing from the gist of the invention. Hereinafter, modified examples will be described. In the description of the modified examples, the same configurations as those of the embodiment are denoted by the same reference numerals and signs, and the description thereof is omitted.

A. Bump

Although the embodiment described above has been described with an example in which one bump 20a (a bump whose center does not overlap the inductors) is provided, a plurality of bumps 20a may be provided. It is sufficient to arrange as many bumps as necessary according to the number of inductors to be arranged or the arrangement of the inductors such that the inductor and the center of the bump do not overlap each other in the plan view.

B. Inductor

Although the embodiment described above has been described with an example in which the three inductors 52a to 52c are included in the LNA 52, the number of inductors or the circuit block including the inductors is not limited to this. For example, one or two, or four or more inductors may be included in the LNA 52, or the PLL 54 may include an inductor. When the PLL 54 includes an inductor, the inductor and the bump are arranged such that the inductor and the center of the bump do not overlap each other in the plan view.

C. Analog Signal

Although the embodiment described above has been described with an example of GPS satellite signals, the invention is applicable also to the semiconductor device 1 that processes other analog signals. That is, the invention is applicable to analog signals of various types of modulating systems or communication systems, for example, signals that are spread and modulated by a CDMA (Code Division Multiple Access) system similarly to GPS satellite signals, or signals of an FDMA (Frequency Division Multiple Access) system, a Bluetooth (registered trademark), an AM (Amplitude Modulation) system, an FM (Frequency Modulation) system, or the like. The invention is preferable when using analog signals at high frequencies.

Although the embodiment described above has been described with an example of GPS satellite signals, signals may be of other satellite positioning systems such as WARS (Wide Area Augmentation System), QZSS (Quasi-Zenith Satellite System), GLONASS (GLObal NAvigation Satellite System), GALILEO, or BeiDou (BeiDou Navigation Satellite System).

D. Electronic Apparatus

The semiconductor device 1 of the invention is applicable to various types of electronic apparatuses. For example, the invention can be applied to various electronic apparatuses such as runners' watches, car navigation systems, mobile navigation systems, personal computers, PDAs (Personal Digital Assistants), mobile phones, or wristwatches.

What is claimed is:

1. A semiconductor device comprising:
  a substrate;
  a first layer that is stacked on the substrate and includes an inductor; and
  a bump group that is arranged above the first layer, wherein
  the bump group includes
    a plurality of bumps that are arranged under a predetermined rule, and
    at least one bump, wherein (i) the at least one bump is different from the plurality of bumps, (ii) at least a portion of the at least one bump overlaps the inductor when the semiconductor device is viewed in a plan view from a direction vertical to a plane on which the bump group is provided, and (iii) a center of the at least one bump does not overlap the inductor when the semiconductor device is viewed in the plan view.

2. An electronic apparatus comprising the semiconductor device according to claim 1.

3. A semiconductor device, comprising:
  a substrate;
  a first layer that is stacked on the substrate and includes an inductor; and
  a bump group that is arranged above the first layer, wherein
  the bump group includes
    a plurality of bumps that are arranged under a predetermined rule, and
    at least one bump that is different from the plurality of bumps and whose center does not overlap the inductor when the semiconductor device is viewed in a plan view from a direction vertical to a plane on which the bump group is provided, wherein
    the substrate is a rectangle in shape in the plan view from the direction vertical to the plane on which the bump group is provided,
    the inductor is located at any of corner portions of the rectangle in the plan view from the direction vertical to the plane on which the bump group is provided, and
    the semiconductor device further includes
      an analog signal processing circuit portion that includes the inductor and processes an analog signal to output a digital signal, and
      a digital signal processing circuit portion that processes the digital signal and is provided spaced apart from the analog signal processing circuit portion in the plan view from the direction vertical to the plane on which the bump group is provided.

4. The semiconductor device according to claim 3, wherein
  the analog signal processing circuit portion includes a power supply circuit portion between the inductor and the digital signal processing circuit portion in the plan view from the direction vertical to the plane on which the bump group is provided.

5. The semiconductor device according to claim 3, wherein
  the digital signal processing circuit portion includes
    a first memory that operates at a first operating frequency, and
    a second memory that operates at a second operating frequency lower than the first operating frequency, and
  a distance between the first memory and the analog signal processing circuit portion is longer than a distance between the second memory and the analog signal processing circuit portion.

6. The semiconductor device according to claim 3, wherein
  the analog signal processing circuit portion is a receiver circuit portion that receives an analog signal.

7. The semiconductor device according to claim 6 further comprising an LNA (Low Noise Amplifier), wherein
  the LNA includes the inductor.

8. The semiconductor device according to claim 6, wherein
  the analog signal is a positioning satellite signal,
  the digital signal processing circuit portion includes
    a correlation operation circuit portion that performs a correlation operation for capturing the positioning satellite signal, and
    a first memory that operates at a first operating frequency, and
  a distance between the first memory and the analog signal processing circuit portion is longer than a distance between the correlation operation circuit portion and the analog signal processing circuit portion.

9. The semiconductor device according to claim 3, wherein
  the analog signal processing circuit portion includes three or more the inductors, and the area of a polygon obtained by connecting centers of the respective inductors in the plan view is from 0.08 mm2 to 0.116 mm2.

* * * * *